US009874587B1

(12) United States Patent
Holcomb

(10) Patent No.: US 9,874,587 B1
(45) Date of Patent: Jan. 23, 2018

(54) ONE-PASS TRIGGER JITTER REDUCTION FOR DIGITAL INSTRUMENTS

(71) Applicant: Keysight Technologies, Inc., Minneapolis, MN (US)

(72) Inventor: Matthew S. Holcomb, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 133 days.

(21) Appl. No.: 15/068,315

(22) Filed: Mar. 11, 2016

(51) Int. Cl.
*G01R 31/20* (2006.01)
*G01R 13/02* (2006.01)

(52) U.S. Cl.
CPC ................. *G01R 13/0254* (2013.01)

(58) Field of Classification Search
CPC .. G06F 17/5036; G06F 3/03547; G06F 3/038; G06F 3/0383; G01R 13/0254; G01R 1/06766; G01R 1/06772; G01R 31/31709; G01R 13/0218; G01R 13/0272; G01R 13/029; G01R 13/32; G01R 23/16; G01R 29/26; G01R 31/31937; G01R 35/00; G01R 13/0263; G01R 19/16552; G01R 21/133; G01R 31/3171; G01N 15/1427; G01N 29/30; G04F 10/005
See application file for complete search history.

(56) References Cited

U.S. PATENT DOCUMENTS

| | | | | |
|---|---|---|---|---|
| 4,975,636 A | * | 12/1990 | Desautels | G01R 13/24 324/121 R |
| 6,753,677 B1 | * | 6/2004 | Weller | G01R 13/0254 324/121 R |
| 6,915,218 B2 | * | 7/2005 | Pickerd | G01R 13/029 324/121 R |
| 2011/0267030 A1 | * | 11/2011 | Roach | G01R 13/0254 324/76.12 |

* cited by examiner

*Primary Examiner* — Vinh Nguyen

(57) ABSTRACT

A system and method: receive an input signal and output digital samples representing the input signal; store the digital samples for at least one acquisition record of the input signal in an acquisition memory; detect a trigger event in the input signal and calculate a trigger address in the acquisition memory for a digital sample corresponding to the detected trigger event; perform digital signal processing on the digital samples of the acquisition memory to produce processed digital samples; detect an edge, representing a trigger, in the processed digital samples, and determine a measured trigger time; temporarily store the processed digital samples in a buffer memory at least until the edge detector detects the edge in the processed digital samples; determine a trigger correction value in response to the measured trigger time; determine a corrected beginning address of the buffer memory from the calculated trigger address and the trigger correction value; and read the processed digital data out from the buffer memory beginning at the corrected beginning address.

20 Claims, 7 Drawing Sheets

ONE-PASS TRIGGER JITTER REDUCTION FOR DIGITAL INSTRUMENTS

BACKGROUND

Digital instruments are used to test and analyze signals from electrical and electronic devices and systems. One example of a digital instrument is a real time digital oscilloscope. Real time digital oscilloscopes operate by digitizing closely spaced consecutively sampled values of an input signal, storing the digital samples in a memory, and then re-constructing the waveform as a displayable image (the "trace") on a display device by reading and processing the stored digital samples. We shall call the stored digital samples an "acquisition record" and note that its contents correspond to a definite time interval in the history of the input signal's behavior. The length of that time interval is largely determined by the number of addressable memory locations devoted to the signal's acquisition (the memory's "depth") and the rate at which the digital samples are acquired. That sample rate should be high enough to meet Nyquist sampling and bandwidth requirements.

It often happens that the acquisition record contains many times more digital samples than are displayed at any one time, allowing the operator to select as the displayed trace a size (degree of zoom) and location (panning) of a subset of the acquisition record. To support panning and zooming, and because the sampled values generally have an arbitrary relationship to the horizontal pixel positions in the display, the digitized data stored in the acquisition record may be algorithmically processed to produce a graphics image in a display buffer, from whence is created a display trace. That is, the data is not displayed immediately while the variations in its corresponding input signal are occurring. Only the taking of the samples is performed in real time, and once they are stored the display is a low speed representation of what the oscilloscope remembers having sampled. Furthermore, those digital samples in the acquisition record that correspond to the displayed trace are not necessarily the same in number as the number of horizontal pixel positions in the display, and digital signal processing techniques are commonly used to produce equivalent Y amplitude values that most probably would have been measured had there been true alignment between the consecutive samples and the horizontal pixel positions. This rendering operation is essentially a process of interpolation.

Furthermore, the vast majority of oscillographic activities require that the displayed portion of the acquisition record be in some "defined relation" to a detected event originating outside the oscilloscope, whether that is a particular type of signal condition or transition occurring in the signal being measured, or a condition or transition in some other signal that is related to the signal being measured. The detection and operational response to this "defined relation" is called triggering; in the first case it is termed "internal" triggering, and the detected event is referred to as a "trigger event."

When viewing a recurrent waveform in the "normal" mode, triggering is what allows the trace to "stand still" for viewing.

An oscilloscope's trigger function is important to achieve clear signal characterization, as it synchronizes the horizontal sweep of the oscilloscope to the proper point of the signal. The trigger control enables users to stabilize repetitive waveforms. By repeatedly displaying similar portion of the input signal, the trigger makes repetitive waveform look static. The displayed trace may represent waveform activity that preceded the trigger, occurred after the trigger, or some combination of the two.

Oscilloscopes offer various types of trigger functions, with edge triggering is the most basic and common type.

Digital oscilloscopes, however, feature numerous specialized trigger settings not otherwise available in analog oscilloscopes. These triggers enable users to easily detect, for instance, a pulse that is narrower than usual. Such a condition would not be detected by a voltage threshold trigger only.

Advance trigger controls allow users to isolate events of interest to enhance the oscilloscope's record length and sample rate. Some oscilloscopes even offer advanced triggering capabilities with highly selective control, allowing users to trigger on pulses defined by time (such as glitch, pulse width, setup-and-hold, slew rate and time-out), defined by amplitude (runt pulses), and delineated by pattern or logic state (such as logic triggering). If the trigger location is included in the visible portion of the acquisition record, then it is customary to indicate its location in the trace with some stylized indicia.

Since digital sample acquisition and trigger acquisition have different paths within the oscilloscope, there is an inherent time delay between the acquired digital samples and the trigger position, which results in skew and trigger jitter. Jitter is noise in the temporal or timing domain. In particular, trigger jitter may be defined as a short-term variation in a significant instant of a timing signal (e.g., the instant where the triggering event occurs in a trigger signal) from its ideal position in time. The causes of trigger jitter are the same as for other sources of random jitter: varying temperature, imperfect components, and external noise sources. Trigger jitter is often specified for a given digital oscilloscope model, and may be on the order of a few picoseconds or less.

Should the detection of the trigger condition occur at slightly varying times relative to the actual event to which it is supposed to correspond (which might be, say, an abruptly rising edge or simply a crossing of a threshold in a selected direction), then the trace will not stand still, but will appear to slide back and forth along the time axis by the amount of variation. The variation in the appearance of the trace that can be traced to such instability is called "trigger jitter."

Trigger jitter can generally be observed for any sufficiently fast repetitive signal. It arises out of the (inevitable and unavoidable) trigger delay between: (a) when the trigger condition in the signal being measured actually occurs; and, (b) when an internal trigger signal indicative of that condition becomes available and is subsequently used within the oscilloscope. If the delay from (a) to (b) is always the same, then there is no trigger jitter, even though the slight trigger delay manifests itself as some constant offset. Alas, there are several causes for trigger jitter that are hard to eliminate. The bottom line is that various circuit parameters will drift, especially as function of temperature, and circuits, especially threshold circuits, are susceptible to noise.

There is yet one more background topic of interest concerning triggering. It will be appreciated that the triggering event is under no obligation to occur in simultaneity with a taking of a digital sample of the input signal. Note that the acquisition record amounts to a time axis along which are placed the various real time digital samples. What is done for each trigger event, then, is to take note of some time difference between that trigger event and some cardinal aspect of the time axis for the samples. Say, the trigger falls between sample numbers n and n+1. Then it is useful to note that the trigger occurred r-many picoseconds after sample number n, or s-many picoseconds before sample number n+1. This is an established technique that generally goes by the name "trigger interpolation" (the alternative to which is to simply assign the trigger event to one of the two samples). There may be some jitter in successive trigger interpolation values themselves during a free running display of the trace, although it is generally less than the sample-to-sample interval. Nevertheless, as a process conditioned upon the triggering process generally, jitter in the trigger interpolation values will manifest itself as an additional source of trigger jitter in the displayed trace for a sequence of consecutive acquisition sample records.

The result is that, unless other provisions are made, consecutive acquisition records would be misaligned from one another by the amount of overall trigger jitter, which would be clearly visible in the normal mode trace for a sufficiently fast repetitive input signal.

Various solutions to the problems of horizontal jitter in digital oscilloscopes have been developed. For example, U.S. Pat. No. 6,753,677 discloses systems and methods which determine the precise location in the acquisition record where the triggering event should have occurred. This allows the determination of a correct and jitter free horizontal trigger position value. The disclosed techniques rely on standard triggering hardware to locate the waveform's trigger event to within some small error, perhaps 1 ns or less, and process the acquired data acquired around the trigger event, optionally correcting the signal for the various impairments in the channel's signal path, and then locate the time of the trigger threshold being crossed in the data, using this value for plotting, measurements, and any further signal processing. This reduction or elimination of visible trigger jitter is referred to herein as "jitter-free" display and is also beneficial to measurements made on the displayed trace.

However, in some cases the trigger jitter elimination or reduction techniques, such as disclosed in U.S. Pat. No. 6,753,677, can take a significant amount of time. For example, the trigger jitter correction circuits operate by retrieving some or all of the acquisition record from the acquisition memory, processing the retrieved data (which may take some considerable time), and then determining the "jitter free" trigger position from the processed data. Once the "jitter free" trigger position is determined, the acquisition record is then retrieved a second time from the acquisition memory, now aligned with the timing of the "jitter free" trigger, and processed again, this second time for display. Accordingly, it would be desirable to provide techniques for reducing or eliminating trigger jitter in a digital oscilloscope which can more quickly produce a visible trigger fitter free display of acquired data.

SUMMARY

According to one aspect of the invention, a system comprises: a signal acquisition subsystem configured to receive an input signal and in response thereto to output a plurality of digital samples representing the input signal; an acquisition memory configured to receive the digital samples and to store therein the digital samples for at least one acquisition record of the input signal; a trigger detector configured to detect a trigger event in the input signal and to calculate a trigger address in the acquisition memory for a digital sample corresponding to the detected trigger event in the input signal; an acquisition memory read-out controller configured to control reading of the digital samples out of the acquisition memory; a digital signal processor config-ured to receive the digital samples output from the acquisition memory under control of the acquisition memory read-out controller, and to process the digital samples to produce processed digital samples; an edge detector configured to detect an edge, representing a trigger, in the processed digital samples, and in response thereto to determine and output a measured trigger time; a buffer memory configured to temporarily store the processed digital samples output by the digital signal processor at least until the edge detector detects the edge in the processed digital samples; a trigger correction value generator configured to receive the measured trigger time from the edge detector, and in response thereto to determine and output a trigger correction value; and a buffer memory read-out controller configured to receive the trigger correction value and in response thereto to control reading of the processed digital samples out of the buffer memory beginning at a corrected beginning address of the buffer memory determined from the calculated trigger address and the trigger correction value.

In some embodiments, the system further includes a display device configured to display the processed digital samples beginning at the corrected beginning address of the buffer memory.

In some embodiments the system further includes a user interface configured for a user to control one of more parameters for the display of the processed digital samples.

In some embodiments, the digital signal processor is configured to perform at least one of vertical scaling, inversion, random dithering, bandwidth shaping, and interpolation of the digital samples to produce the processed digital samples.

In some embodiments, the trigger correction value generator is further configured to provide the trigger correction value to the acquisition memory read-out controller.

In some versions of these embodiments, the system further includes: a second signal acquisition subsystem configured to receive a second input signal and in response thereto to output a plurality of second digital samples representing the second input signal; and a second acquisition memory configured to receive the second digital samples and to store therein the second digital samples for at least one acquisition record of the second input signal, wherein the acquisition memory read-out controller is further configured to control reading of the second digital samples out of the second acquisition memory beginning at a corrected beginning address of the second acquisition memory determined from the calculated trigger address and the trigger correction value.

In some versions of these embodiments, the digital signal processor is further configured to receive the second digital samples output from the second acquisition memory in response to the acquisition memory read-out controller, and to process the second digital samples to produce second processed digital samples.

In some embodiments, the edge detector and the buffer memory are configured to receive the same processed digital samples at a same time as each other, and the buffer memory is configured to store at least all of the processed digital samples from the beginning of the acquisition record until the detected edge, representing the trigger, in the processed digital samples.

In some embodiments, the digital signal processor is configured to receive the digital samples from the acquisition memory in two channels, including a first channel of the digital samples starting at a beginning address of the acquisition record in the acquisition memory and a second channel operating in parallel with the first channel beginning at an address which is a defined number of addresses prior to the calculated trigger address, the digital signal processor further being configured to process the digital samples of the first channel and output the processed digital samples of the first channel to the buffer memory, and in parallel to process the digital samples of the second channel and output the processed digital samples of the second channel to the edge detector.

In some versions of these embodiments, the trigger correction value generator is further configured to provide the trigger correction value to the acquisition memory read-out controller, and the system is configured to compare a size of the acquisition record to a threshold, and is further configured such that when the size of the acquisition record exceeds the threshold: the digital signal processor switches to processing a single channel of the digital samples starting at a beginning address of the acquisition record in the acquisition memory and outputting the processed digital samples of the single channel to the edge detector; and the acquisition memory read-out controller controls reading of the digital samples out of the acquisition memory a second time beginning at a corrected beginning address of the acquisition memory determined from the calculated trigger address and the trigger correction value.

In some versions of these embodiments, the trigger correction value generator is configured to determine the trigger correction value from only a subset of the processed digital samples from the digital signal processor which are in a defined range about the measured trigger time, excluding from the determination of the trigger correction value processed digital samples from the digital signal processor which are outside the defined range.

In some versions of these embodiments, the size of the buffer memory is approximately the same as the subset of the processed digital samples.

According to another aspect of the invention, a method comprises: receiving an input signal and in response thereto outputting a plurality of digital samples representing the input signal; storing the digital samples for at least one acquisition record of the input signal in an acquisition memory; performing digital signal processing on the digital samples output from the acquisition memory in response to an acquisition memory read-out controller to produce processed digital samples; detecting an edge, representing a trigger, in the processed digital samples, and in response thereto determining and outputting a measured trigger time; temporarily storing the processed digital samples output by the digital signal processor in a buffer memory at least until the edge detector detects the edge in the processed digital samples; determining and outputting a trigger correction value in response to the measured trigger time from the edge detector; determining a corrected beginning address of the buffer memory from the calculated trigger address and the trigger correction value; and reading the processed digital data out from the buffer memory beginning at the corrected beginning address of the buffer memory.

In some embodiments, the method further includes displaying the processed digital samples on a display device, beginning at the corrected beginning address of the buffer memory.

In some embodiments, the method further includes receiving via a user interface one of more parameters for the display of the processed digital samples.

In some embodiments, performing the digital signal processing includes performing at least one of vertical scaling, inversion, random dithering, bandwidth shaping, and interpolation of the digital samples to produce the processed digital samples.

In some embodiments, the method further includes: receiving a second input signal and in response thereto outputting a plurality of second digital samples representing the second input signal; storing the second digital samples for at least one acquisition record of the second input signal in a second acquisition memory; and reading the second digital samples out of the second acquisition memory beginning at a corrected beginning address of the second acquisition memory determined from the calculated trigger address and the trigger correction value.

In some versions of these embodiments, the method further includes processing the second digital samples to produce second processed digital samples.

In some embodiments, the method further includes storing in the buffer memory at least all of the processed digital samples from the beginning of the acquisition record until the detected edge, representing the trigger, in the processed digital samples.

In some embodiments, the method further includes further comprising processing the digital samples from the acquisition memory in parallel in two channels, including a first channel of the digital samples starting at a beginning address of the acquisition record in the acquisition memory and a second channel operating in parallel with the first channel beginning at an address which is a defined number of addresses prior to the calculated trigger address, and outputting the processed digital samples of the first channel to the buffer memory in parallel with outputting the processed digital samples of the second channel to an edge detector for detecting the edge, representing the trigger, in the processed digital samples within the subset of the processed digital samples.

In some versions of these embodiments, the method further includes: comparing a size of the acquisition record to a threshold, and when the size of the acquisition record exceeds the threshold: switching the digital signal processor to processing a single channel of the digital samples starting at a beginning address of the acquisition record in the acquisition memory, and outputting the processed digital samples of the single channel to the edge detector; and reading the digital samples out of the acquisition memory a second time beginning at a corrected beginning address of the acquisition memory determined from the calculated trigger address and the trigger correction value.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

As noted above, unless other provisions are made, trigger jitter can cause consecutive acquisition records displayed by an oscilloscope to be misaligned from one another by the amount of overall trigger jitter, which would be clearly visible in the normal mode trace for a sufficiently fast repetitive input signal.

Figure 1:
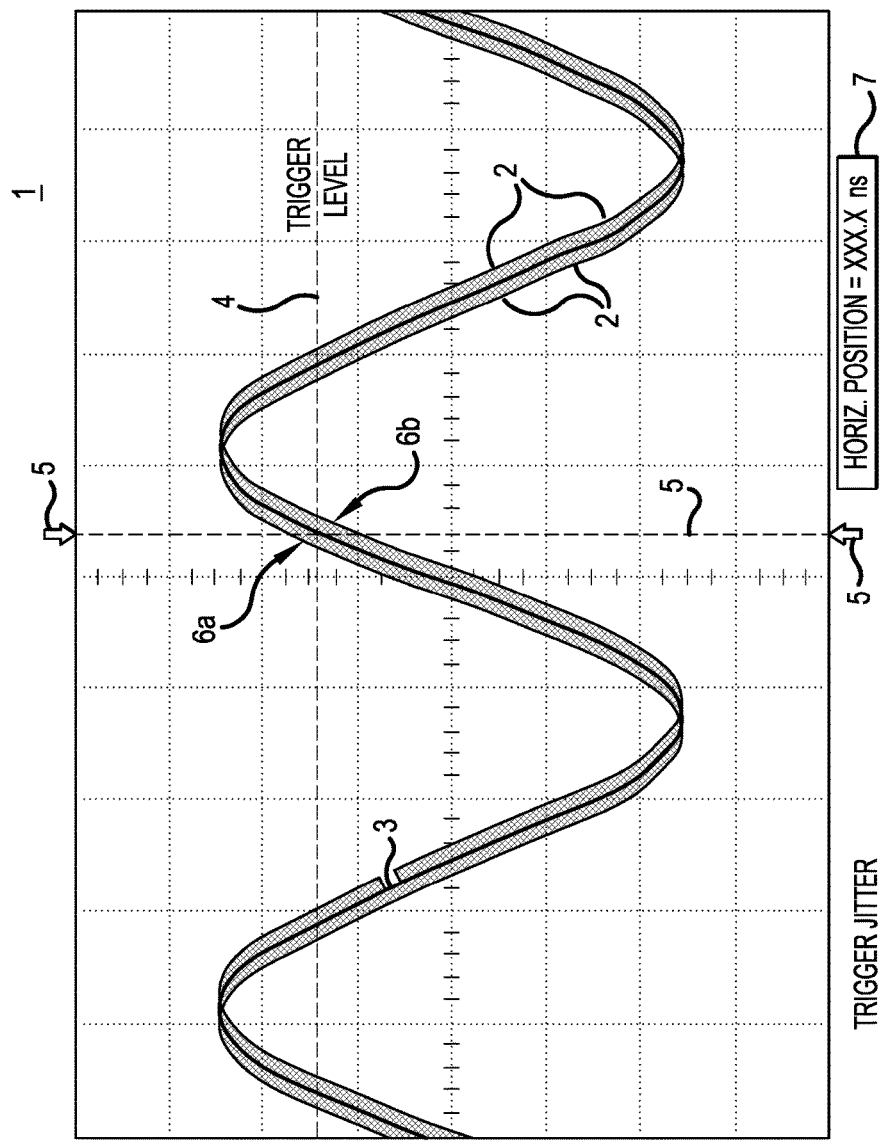
FIG. 1 is a simplified depiction of a digital oscillographic display of a trace containing trigger jitter.

FIG. 1 is a simplified depiction of a simplified depiction 1 of an internally triggered, free running, real time digital oscillographic display of a trace (2, 3) containing trigger jitter. The solid dark line 3 indicates what an ideal trace would look like, if there were no trigger jitter and the signal was otherwise clean and stable. The cross hatched regions 2 on either side of the solid dark line 3 represent the extent of the actual trace, owing to the presence of trigger jitter. Depending on how the jitter is distributed, there may well be a central darker region of the trace corresponding to solid dark line 3, indicating that the amount of jitter is more often smaller than it is larger. On the other hand, the amount of jitter might be nearly evenly distributed, resulting in little or no pronounced central trace within a suspiciously fat trace of near uniform brightness.

To continue, the work signal whose trace (2, 3) we see in FIG. 1 is a sine wave that triggers the oscilloscope when it crosses a threshold trigger level 4 while exhibiting a positive slope. A horizontal position icon 5 indicates the location in the displayed trace that corresponds to the currently selected horizontal position value 7, which is an offset from where the trigger event occurred. If the currently selected horizontal position 7 was at zero, then horizontal position icon 5 would also indicate the trigger. (For the sake of clarity in the figure we have arranged the display such that the location indicated by horizontal position icon 5 is the trigger but does not fall on a graticule line. FIG. 1 is perhaps somewhat contrived in this regard, but valid, nonetheless.) As can be seen from arrows 6a and 6b, the amount of apparent jitter in the trigger threshold is about 70% of one division along the Y (signal amplitude) axis. Now, if all the jitter in the trace (2, 3) were indeed due to uncertainty and lack of stable repeatability in the threshold comparison mechanism proper, then we would be in the market for a seriously improved threshold comparator. However, the threshold comparator itself is nowhere near that bad, and much of the apparent amplitude variability is actually time variation in the path of the trigger signal.

U.S. Pat. No. 6,753,677, the entirety of which is incorporated herein by reference as if fully set forth herein, discloses trigger jitter elimination or reduction techniques. However, these techniques can slow down the display of acquired data. For example, the trigger jitter correction circuits of some oscilloscopes may operate by retrieving some or all of the acquisition record from the acquisition memory, processing the retrieved data (which may take some considerable time), and then determining the "jitter free" trigger position from the processed data. Once the "jitter free" trigger position is determined, the acquisition record is then retrieved a second time from the acquisition memory, now aligned with the timing of the "jitter free" trigger, and processed for display. Accordingly, it would be desirable to provide techniques for reducing or eliminating trigger jitter in a digital oscilloscope which can more quickly produce a visible display of acquired data free of visible trigger-jitter.

Figure 2:
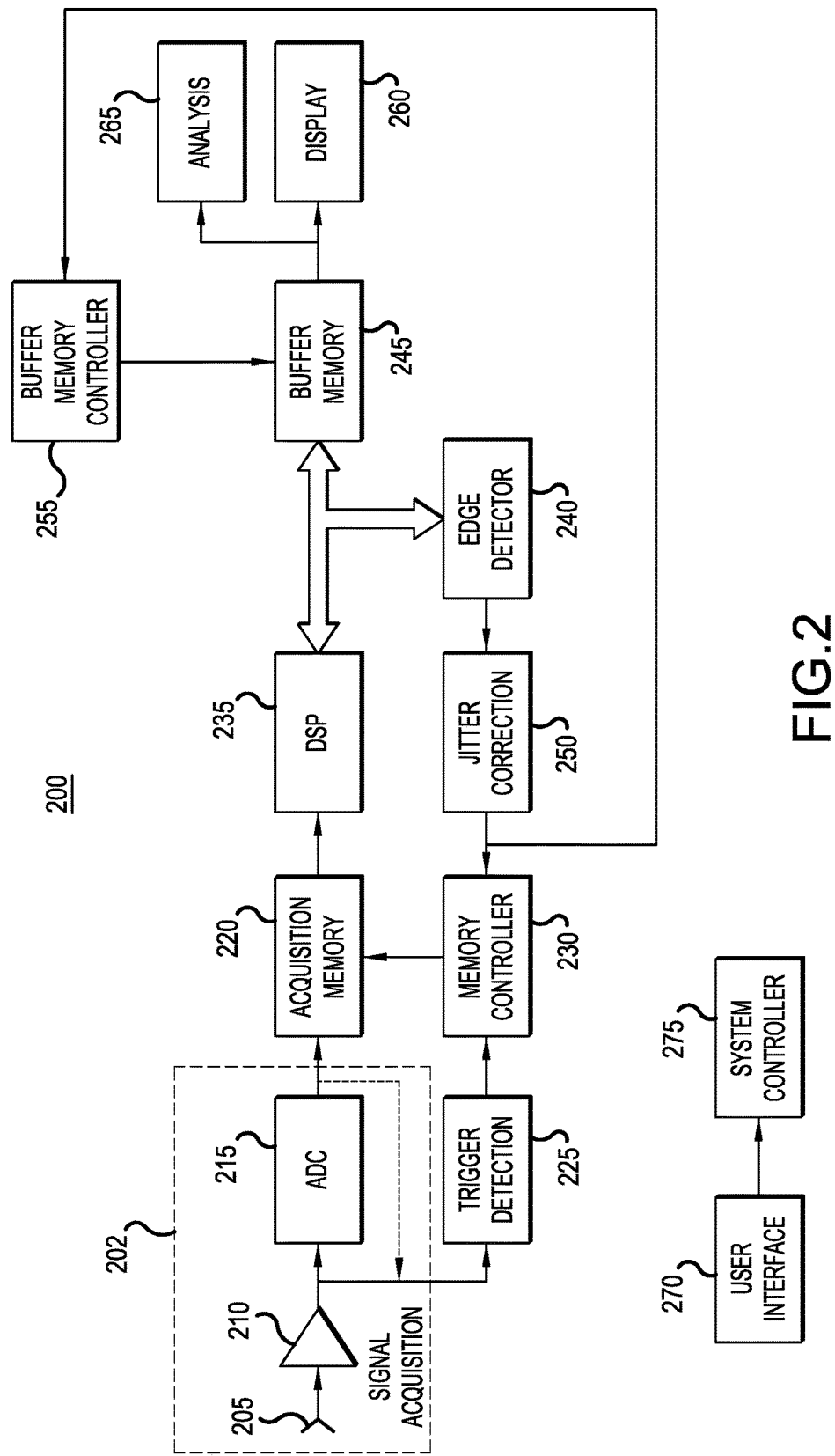
FIG. 2 is a simplified functional block diagram of a first example embodiment of an internally triggered real time digital oscilloscope which may reduce or eliminate trigger jitter.

FIG. 2 is a simplified functional block diagram of a first example embodiment of an internally triggered real time digital oscilloscope 200 which may reduce or eliminate trigger jitter and produce a display more rapidly that some known prior art arrangements.

Digital oscilloscope 200 includes: a signal acquisition subsystem 202; an acquisition memory 220; a trigger detector 225; an acquisition memory read-out controller 230; a digital signal processor (DSP) 235; an edge detector 240; a buffer memory 245; a trigger correction value generator (denoted as "jitter correction") 250; a buffer memory read-out controller 255; a display 260; and an analysis processor 265.

Signal acquisition subsystem 202 includes a probe 205, a signal conditioning circuit (e.g., an amplifier and/or filter, etc.) 210, and an analog-to-digital converter (ADC) 215 (which may have a sample clock, not shown).

In some embodiments, acquisition memory 220, trigger detector 225, acquisition memory read-out controller 230, digital signal processor 235, edge detector 240, buffer memory 245, trigger correction value generator 250, and buffer memory read-out controller 255 may all be includes in a same integrated circuit (IC) as each other.

As will be discussed in greater detail below, digital signal processor 235 may perform one or more of the following operations: vertical scaling, inversion, random dithering, bandwidth shaping, and interpolation.

Display 260 may include a display memory or frame buffer, and a display device, such as a cathode ray tube (CRT), a liquid crystal display (LCD), a plasma display, etc.

Analysis processor 265 may analyze processed data from acquisition memory 220, for example to obtain statistical characteristics pertaining to the corresponding acquisition record, such as maximum values, minimum values, average values, etc.

Also shown in FIG. 2 are a system controller 270 and a user interface 275.

System controller 270 may include one or more microprocessors and associated memory storing therein processor instructions for execution by the microprocessor(s). Execution of the processor instructions may cause system controller 270 to control operations of digital oscilloscope 200 so as to perform one or more algorithms or methods as described herein, including for example the method 300 described below. In some embodiments, system controller 270 may incorporate some or all of the following functional blocks of FIG. 2: acquisition memory read-out controller 230, trigger correction value generator 250, buffer memory read-out controller 255, and analysis processor 265.

User interface 275 is configured for a user to control one of more parameters for the display by display 260 of processed digital samples from an acquisition record stored in acquisition memory 220. User interface 275 may include one or more of a keypad, touchscreen, control knob(s), switch(es), trackball, mouse, keyboard, etc. In some cases, user interface 275 may be remotely hosted, for example by a computer which is connected to digital oscilloscope 200, and may communicate with system controller 270 via a communication link, for example via a local area network (LAN), the Internet, etc.

Operationally, signal acquisition subsystem 202 is configured to receive an input signal, via probe 205, and in response thereto to output a plurality of digital samples representing the input signal. Acquisition memory 220 is connected to receive the digital samples from signal acquisition subsystem 202, and to store the digital samples for at least one acquisition record of the input signal.

Meanwhile, trigger detector 225 detects a trigger event in the input signal, for example input data crossing a trigger threshold, either in the analog or digital domain, and from this a "trigger address" is calculated or determined, corresponding to the address in acquisition memory 220 where the digital sample is stored which was acquired at or nearest to where the trigger event occurred in the input signal. FIG. 2 shows an example embodiment where trigger detector 225 operates in the analog domain, but dashed lines are included to show how, alternatively, the input to trigger detector could be a digital signal at the output of ADC 215 in an embodiment where the trigger detector operated in the digital domain. In some embodiments, trigger address calculation may be performed, for example, by system controller 270, and the calculated trigger address may be passed to acquisition memory read-out controller 230, which as explained above, in some embodiments may be included in system controller 270. However, as noted above, errors are inevitably made in determining when the trigger occurred, and therefore in calculating the corresponding trigger address, resulting in trigger jitter. Accordingly, as will be discussed in greater detail below, digital oscilloscope 200 includes trigger correction value generator 250 to determine and output a trigger correction value which may be used to reduce or eliminate trigger jitter.

Acquisition memory read-out controller 230 is configured to control reading of the digital samples of an acquisition record out from acquisition memory 220. Initially, acquisition memory read-out controller 230 controls acquisition memory 220 memory to read out the digital samples of the acquisition record at a beginning address corresponding to the calculated trigger address from trigger detector 225. As will be described in greater detail below, if there are subsequent analysis requests for the same acquisition record, acquisition memory read-out controller 230 may control acquisition memory 220 memory to read out the digital samples of the acquisition record in accordance with a corrected beginning address of acquisition memory 220 which may be determined from the calculated trigger address and the trigger correction value.

Digital signal processor 235 is configured to receive the digital samples output from acquisition memory 220 under control of acquisition memory read-out controller 230, and to process the digital samples to produce processed digital samples. Digital signal processor 235 may perform one or more of the following operations on the digital samples received from acquisition memory 220: vertical scaling, inversion, random dithering, bandwidth shaping, and interpolation of the digital samples.

The output of digital signal processor 235 is connected to the input of edge detector 240 to provide the processed digital samples to edge detector 240. Edge detector 240 is configured to detect an edge, representing the trigger, in the processed digital samples. Edge detector 240 is further configured to output a measured trigger time corresponding to the detected edge indicating the trigger.

Trigger correction value generator 250 is configured to receive the measured trigger time from the edge detector, and in response thereto to determine and output a trigger correction value.

Beneficially, trigger correction value generator 250 is configured to determine the trigger correction value from only a subset of the processed digital samples from digital signal processor 235 which are in a defined range about the measured trigger time, excluding from the determination of the trigger correction value those processed digital samples from digital signal processor 235 which are outside the defined range.

Figure 3:
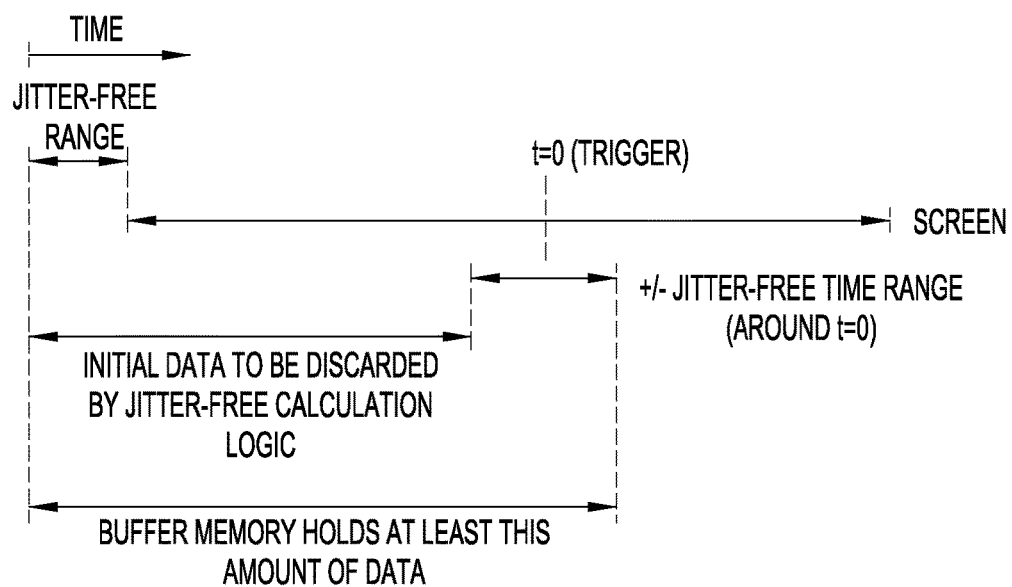
FIG. 3 illustrates timing of some operations performed in a method of operating an oscilloscope.

FIG. 3 illustrates timing of some operations performed in a method of operating digital oscilloscope 200. In particular, FIG. 3 illustrates that trigger correction value generator 250 is configured to discard a certain number of samples before performing its calculation of the trigger correction value. Trigger correction value generator 250 only employs those digital samples within a predefined "jitter-free time range" around the measured trigger time from edge detector to calculate or determine the trigger correction value. A variety of algorithms may be employed by trigger correction value generator 250 to calculate or determine the trigger correction value. For example, U.S. Pat. No. 6,753,677 discloses trigger jitter elimination or reduction techniques which may be employed by digital oscilloscope 200 including trigger correction value generator 250.

Figure 4:
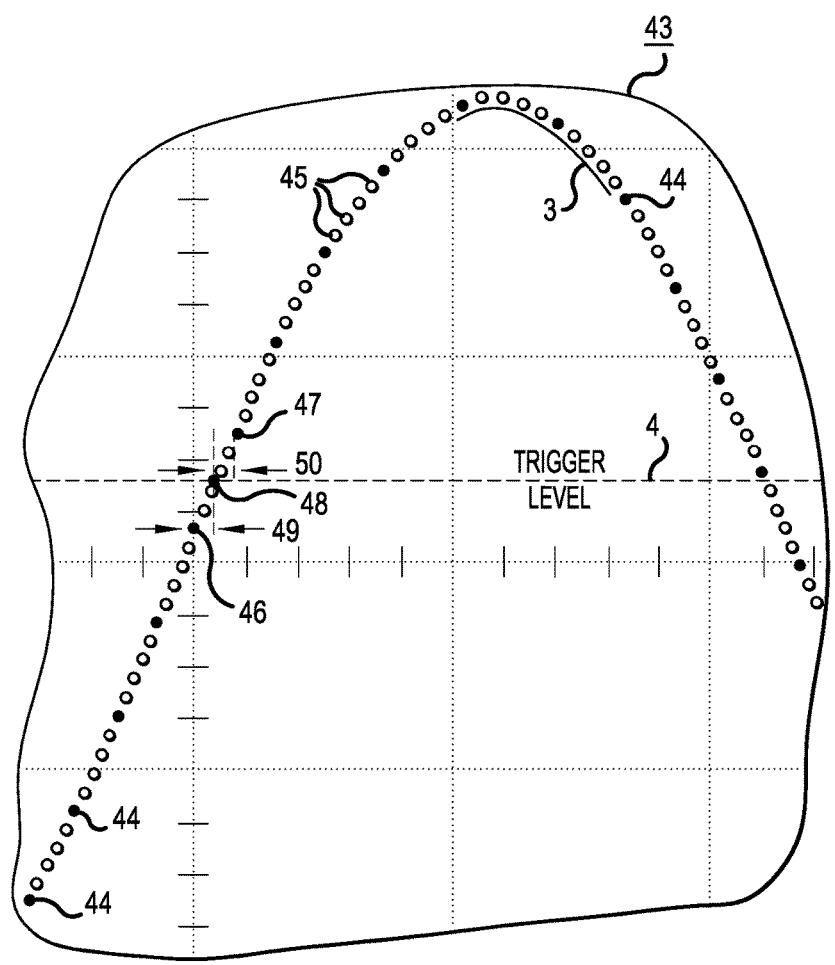
FIG. 4 is a simplified depiction of a trace, such as that of FIG. 1, from which trigger jitter has been removed.

FIG. 4 is a simplified depiction of a trace, such as that of FIG. 1, from which trigger jitter has been removed, for example using an algorithm such as is disclosed in U.S. Pat. No. 6,753,677.

In particular, FIG. 4 depicts a portion 43 of the trace 3 of FIG. 1 that has been rendered and displayed with a jitter-free trigger. In the trace the solid dots 44 represent actual samples taken by the ADC 215 and that are part of the acquisition record stored in acquisition memory 220. Interspersed between the solid dots 44 are hollow dots 45 that represent the additional points produced by an interpolation filter implemented by digital signal processor 235. For clarity the dots are shown further apart than they would ordinarily be in an actual displayed trace. Note also the trigger level 4, which typically intersects the trace 3 at a location that is not represented by an actual sample represented by a solid dot 44, and that very probably does not fall on an interspersed location represented by a hollow dot 45, either. Further, note "sample zero" (46) and "sample one" (47). These are the actual samples defining a region in time in the vicinity of which the trigger event occurred. In the example of FIG. 4 the location (48) where the trace crosses the threshold 4 is clearly an interior point of that region of time. In the general case it could be at least as early as sample zero, and at least as late as just before sample one.

Ordinarily, we would expect that trigger detector 225 would detect the trigger event at the time interval marked 49 in FIG. 4 and would calculate a trigger address corresponding to "sample zero" (46) or "sample one" (47). If there was no trigger jitter, then that would indeed be the case. However, as we have already said, that is typically not the case, and the calculated trigger address is generally in error by the amount we call trigger jitter. So, we want to find the time interval 49 and use it in place of the calculated trigger address. Trigger correction value generator 250 may determine a trigger correction value to be combined with the calculated trigger address to accomplish this.

Again, various details of an example embodiment of a trigger correction value algorithm which may be executed by trigger correction value generator 250 may be understood by reference to U.S. Pat. No. 6,753,677, and such details will not be described here. For our purposes, it is sufficient to understand that various algorithms exist which may be performed by trigger correction value generator 250, and may be further developed, by which trigger correction value generator 250 can produce the trigger correction value.

Trigger correction value generator 250 can provide the trigger correction value to acquisition memory read-out controller 230 and buffer memory read-out controller 255.

Once the calculated address of the trigger in acquisition memory 220 has been corrected to be jitter-free, then acquisition memory read-out controller 230 could once again read out the digital samples for the acquisition record from acquisition memory 220 at a new, corrected, beginning memory address determined from the calculated trigger address and the trigger correction value. This may be referred to as "two-pass jitter free" display of the input signal, as the digital samples are read out from acquisition memory 220 and pass through and are processed by digital signal processor 235 two times before they are displayed.

However, the "first pass" which includes the preliminary processing of the digital samples to determine the trigger correction value can take a significant amount of time, especially if digital signal processor 225 performs a lot of filtering of the digital samples. Accordingly, in some cases the overhead of doing the processing to determine the corrected beginning memory address for reading the digital samples out of acquisition memory 220 for jitter free display may be as much as 100%, for example when there are very few points on the screen to be plotted (i.e., at the fastest sweep speeds) and digital oscilloscope 200 just plots the same input signal on which it is triggering (which is often the case).

However, beneficially, digital oscilloscope 200 includes buffer memory 245 which is configured to temporarily store the processed digital samples output by digital signal processor 235 at least until edge detector 225 detects the edge in the processed digital samples. Accordingly, buffer memory read-out controller 255 may receive the trigger correction value and in response thereto control reading of the processed digital samples out of buffer memory 245 beginning at a corrected beginning address of buffer memory 245 which is determined from the calculated trigger address and the trigger correction value.

That is, rather than reading the digital samples out of acquisition memory 220 two times (a first time to determine the jitter-free trigger point, and a second time aligned with the jitter-free trigger point) in order to create a display sweep, digital oscilloscope 200 may only need to read the digital samples out of acquisition memory 220 one time as the processed data samples are already available in buffer memory 245 and ready to create the display sweep as soon as trigger correction value generator 250 determines the trigger correction value. This latter technique is referred to herein as "one-pass jitter free" display of the input signal.

In digital oscilloscope 200, buffer memory 245 should be deep enough to accept all of the processed digital sampled as shown in FIG. 3 from the start until the end of the digital samples which are employed by trigger correction value generator 250 to determine the trigger correction value, at which time buffer memory read-out controller 255 can begin reading the processed digital samples out of buffer memory 245 beginning at the corrected beginning address for display by display 260 and/or analysis by analysis processor 265.

Practically, the processed digital samples do indeed fit into buffer memory 245 when there are not a huge number of samples on the display screen (i.e., digital oscilloscope 200 is set to a very fast sweep speed), and the trigger is on-screen (meaning digital oscilloscope 200 doesn't have a lot of pre- or post-trigger delay).

In that case, once the corrected beginning address of buffer memory 245 is determined, then buffer memory read-out controller 255 begins reading from buffer memory 245 at the appropriate location to place the actual trigger at the jitter-free trigger time. The time penalty in this case is just the readout time from the start of reading digital samples for the plot out of acquisition memory 220 until the time of when the corrected beginning memory address in buffer memory 245 is determined based on the trigger correction value. This entirely eliminates time for readout and signal processing of digital samples from acquisition memory 220 for the time-corrected plot, as the time-corrected processed digital samples are already available and stored buffer memory 245.

Figure 5:
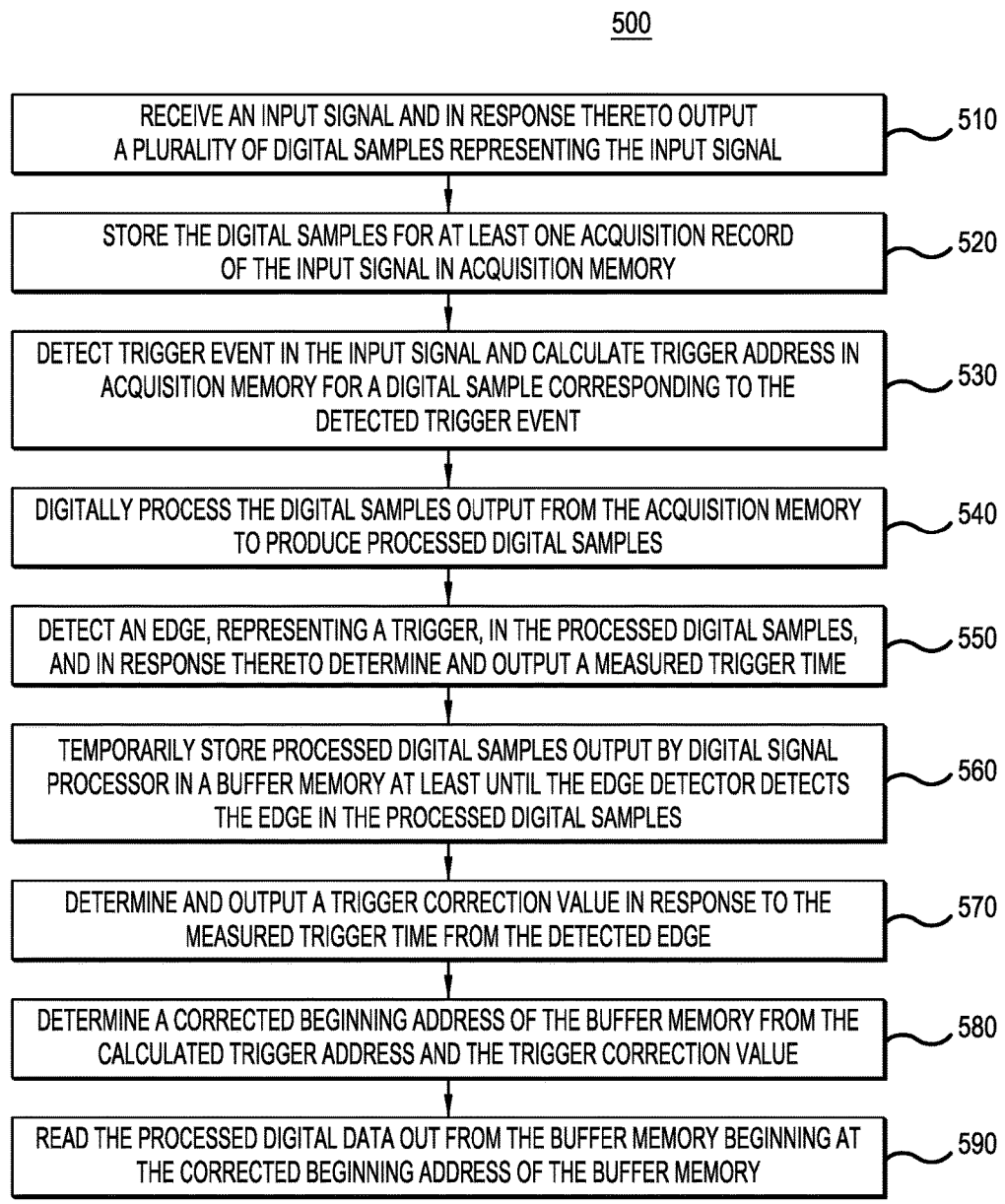
FIG. 5 illustrates a flowchart of an example embodiment of a method of operating an oscilloscope to reduce or eliminate trigger jitter.

FIG. 5 illustrates a flowchart of an example embodiment of a method of operating an oscilloscope, such as digital oscilloscope 200, as generally outlined above.

An operation 510 includes receiving an input signal and in response thereto outputting a plurality of digital samples representing the input signal.

An operation 520 includes storing the digital samples for at least one acquisition record of the input signal in an acquisition memory.

An operation 530 includes detecting a trigger event in the input signal and calculating a trigger address in the acquisition memory for a digital sample corresponding to the detected trigger event in the input signal.

An operation 540 includes performing digital signal processing on the digital samples output from the acquisition memory in response to an acquisition memory read-out controller to produce processed digital samples.

An operation 550 includes detecting an edge, representing a trigger, in the processed digital samples, and in response thereto determining and outputting a measured trigger time.

An operation 560 includes temporarily storing the processed digital samples output by the digital signal processor in a buffer memory at least until the edge detector detects the edge in the processed digital samples.

An operation 570 includes determining and outputting a trigger correction value in response to the measured trigger time from the edge detector.

An operation 580 includes determining a corrected beginning address of the buffer memory from the calculated trigger address and the trigger correction value.

An operation 590 includes reading the processed digital data out from the buffer memory beginning at the corrected beginning address of the buffer memory.

Figure 6:
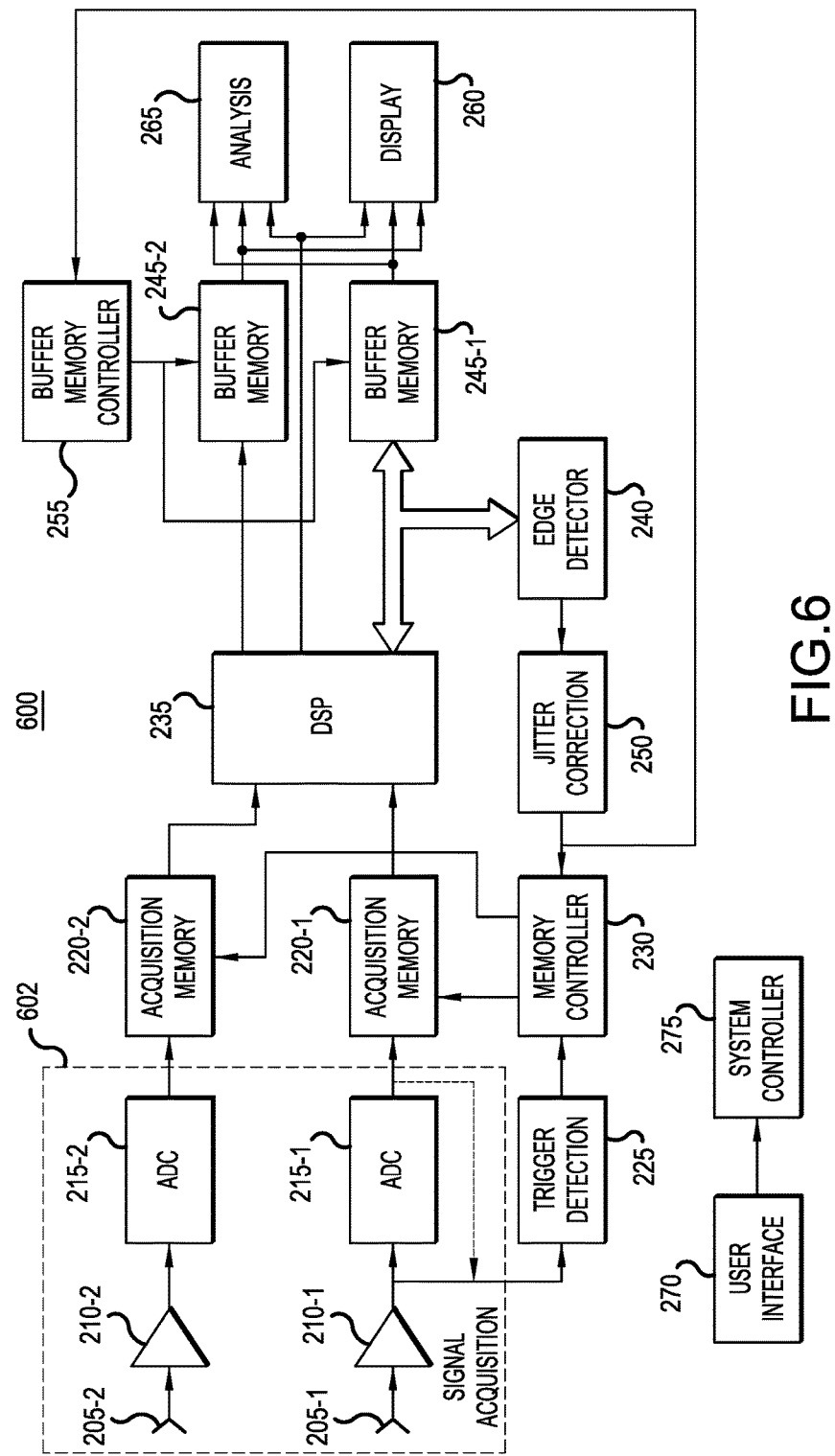
FIG. 6 is a simplified functional block diagram of a second example embodiment of an internally triggered real time digital oscilloscope which may reduce or eliminate trigger jitter.

FIG. 6 is a simplified functional block diagram of a second example embodiment of an internally triggered real time digital oscilloscope 600. Digital oscilloscope 600 is similar to digital oscilloscope 200, so that only the differences therebetween will be described.

In particular, digital oscilloscope is configured to receive, process, and display two input signals at the same time, where the trigger event may be included in one of the two input signals.

Accordingly, digital oscilloscope 600 includes signal acquisition subsystem 602, which in turn includes at least first and second probes 205-1 and 205-2, first and second signal conditioning circuits (e.g., an amplifier and/or filter, etc.) 210-1 and 210-2, and first and second analog-to-digital converters 215-1 and 215-2 (which may have a common sample clock, not shown). The digital samples of the first and second input signals which are output by first and second analog-to-digital converters 215-1 and 215-2 are provided to first and second acquisition memories 220-1 and 220-2.

Assuming that digital signal processor 235 has the same processing resources available and operates at the same speed as in digital oscilloscope 200 which processes and displays a single input signal, then in digital oscilloscope 600 these resources must be shared for processing the digital samples for both input signals, which may mean that the processing speed is approximately cut in half.

Here a shared acquisition memory read-out controller 230 is shown, but in some embodiments first and second acquisition memories 220-1 and 220-2 may have their own separate acquisition memory read-out controllers.

Digital oscilloscope 600 also includes two buffer memories 245-1 and 245-2, one for the processed digital samples of each of the two input signals. Here a shared buffer memory read-out controller 255 is shown, but in some embodiments first and second buffer memories 245-1 and 245-2 may have their own separate buffer memory read-out controllers. By storing the processed digital samples of both input signals in buffer memories 245-1 and 245-2, the processed digital samples are ready to be displayed with a jitter-free trigger as soon as the corrected beginning memory addresses in the buffer memories 245-1 and 245-2 are determined based on the trigger correction value.

It should be apparent from FIG. 6 how digital oscilloscope 600 may be modified to process and display three, four, or more input signals.

Turning back to FIG. 2, in some cases, buffer memory 245 may be too small to accommodate all of the processed digital samples that need to be stored until trigger correction value generator 250 determines the trigger correction value. That may happen if digital oscilloscope 200 has a lot of data points on the display screen, or if there is a lot of pre- or post-trigger delay.

In some cases, the trigger event is not included in the input signal which digital oscilloscope 200 is plotting. That is, the signal which is processed to determine the trigger correction value for a jitter-free trigger is not the same as the input signal which is to be plotted on the display device.

To address these situations, digital signal processor 235 may be configured to operate in a two channel mode, similar to what is shown in FIG. 6.

In this case, one channel is the trigger channel, and the time of the start of the readout of digital samples from acquisition memory 220 is chosen so that trigger correction value generator 250 does not need to discard any digital samples so that the time from the start of the readout until the trigger correction value is determined is kept short. Meanwhile, the second channel processes the digital samples for plotting on the display device. The second channel may process the digital samples of the same signal which includes the trigger event, or it may process digital samples for an entirely separate signal. Regardless, the digital samples for the second channel, which is to be plotted and displayed, are read out from acquisition memory 220 at the left edge of the screen, as described above with respect to FIG. 2. This technique is referred to herein as "one-pass twin-channel jitter free" display of the input signal.

In any case, with two separate signal processing channels in digital signal processor 235, buffer memory 245 only needs to large enough to store therein a number of processed digital samples which is the same size as the jitter-free calculation time range employed by trigger correction value generator 250 to determine the corrected trigger value, which in general may be quite small.

Figure 7:
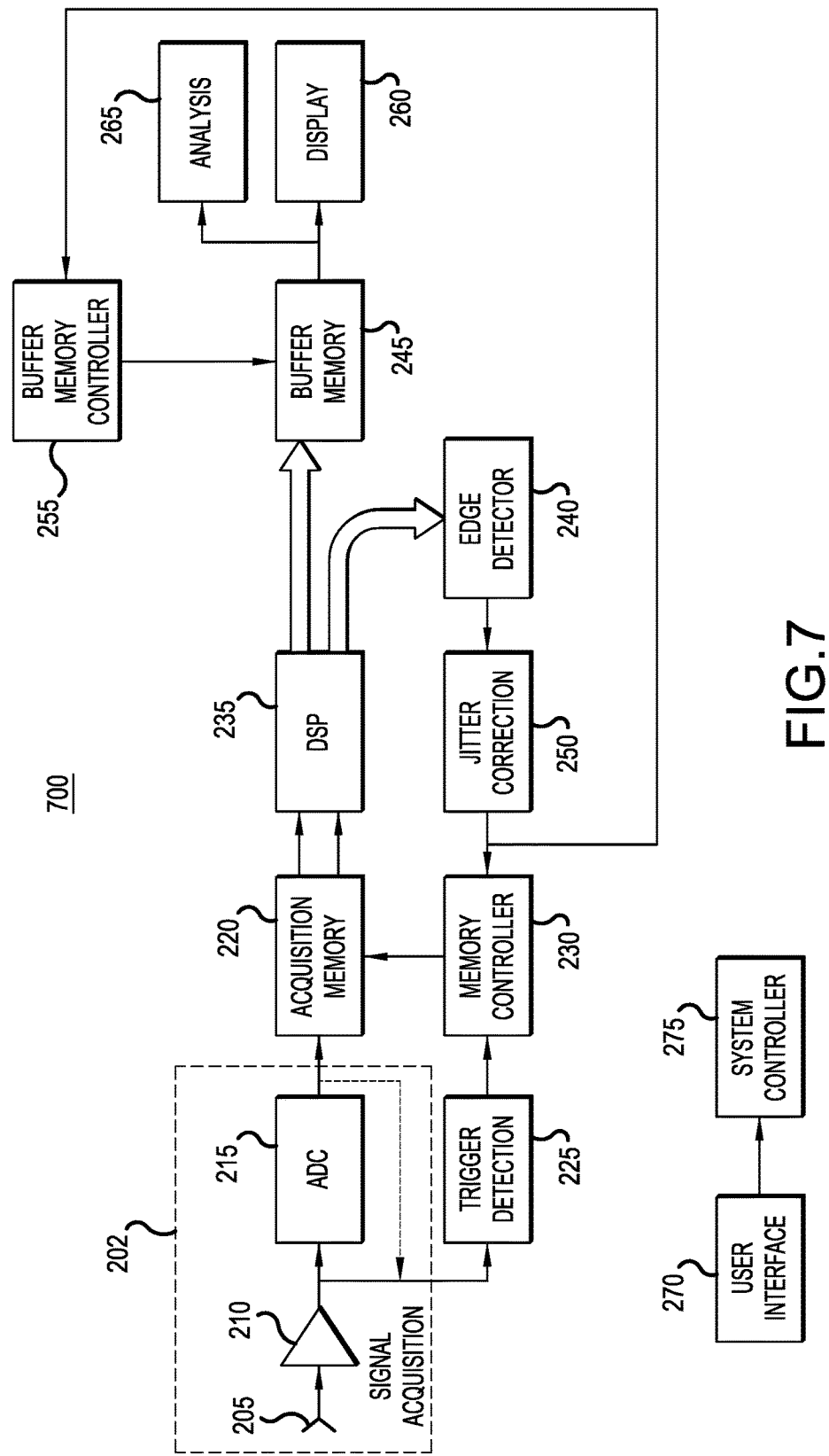
FIG. 7 is a simplified functional block diagram of a third example embodiment of an internally triggered real time digital oscilloscope which may reduce or eliminate trigger jitter.

FIG. 7 is a simplified functional block diagram of a third example embodiment of an internally triggered real time digital oscilloscope 700 which may provide one-pass twin-channel jitter free display of the input signal as described above.

Digital oscilloscope 700 is similar to digital oscilloscope 200, so that only the differences therebetween will be described.

Here, as described above, acquisition memory read-out controller 230 controls acquisition memory 220 to read out the digital samples to digital signal processor 235 in two separate channels beginning at different addresses—one corresponding to the memory address of the digital sample corresponding to the left edge of the screen, and the other corresponding to the first digital sample of the predefined "jitter-free time range" employed by trigger correction value generator 250 for determining the trigger correction value. Accordingly, buffer memory 245 may be rather compact, only large enough for example to store a number of processed digital samples corresponding to the predefined "jitter-free time range."

Digital oscilloscope 700 operating to provide the above-described operating mode one-pass twin-channel jitter free display may overcome the problems described above where the buffer memory is too small to hold all of the data sampled which need to be buffered until the trigger correction value is determined.

However, this benefit comes with a drawback, in that the channel to be plotted only receives half of the bandwidth or resources of the digital signal processor because the digital signal processor is processing the two channels in parallel. For fast sweep speeds, this is generally not an issue, as even half of the bandwidth is more than enough to fully utilize the plotter bandwidth, as a linear interpolator may be employed to generate additional points to be plotted.

However, at some point, when the size of the acquisition record becomes large enough (i.e., the sweep speed is slow enough), the overhead in reading the data out of the acquisition memory a second time becomes less than the reduction in performance caused by having only half of the processing bandwidth for plotting. Accordingly in some embodiments, when the size of the acquisition record exceeds a defined threshold, then the oscilloscope switches back to "two-pass jitter free" display of the input signal. That is, the digital signal processor switches to processing a single channel of the digital samples starting at a beginning address of the acquisition record in the acquisition memory and outputting the processed digital samples of the single channel to the edge detector, and the acquisition memory read-out controller controls reading of the digital samples out of the acquisition memory a second time beginning at the corrected beginning address of the acquisition memory determined from the calculated trigger address and the trigger correction value. However at this point, the oscilloscope is now operating at a lower sweep speed, and the update rate (waveforms/second) is no longer as much of a concern.

While example embodiments are disclosed herein, one of ordinary skill in the art appreciates that many variations that are in accordance with the present teachings are possible and remain within the scope of the appended claims. For example, examples of digital instruments which employ one-pass trigger jitter reduction are provided above in the context of real time digital oscilloscopes. However, the one-pass trigger jitter reduction techniques described above may be applied to other kinds of digital instruments such as logic analyzers and data acquisition modules and instruments, The invention therefore is not to be restricted except within the scope of the appended claims.

The invention claimed is:

1. A system, comprising:
a signal acquisition subsystem configured to receive an input signal and in response thereto to output a plurality of digital samples representing the input signal;
an acquisition memory configured to receive the digital samples and to store therein the digital samples for at least one acquisition record of the input signal;
a trigger detector configured to detect a trigger event in the input signal and to calculate a trigger address in the acquisition memory for a digital sample corresponding to the detected trigger event in the input signal;
an acquisition memory read-out controller coupled to said trigger detector configured to control reading of the digital samples out of the acquisition memory;
a digital signal processor configured to receive the digital samples output from the acquisition memory under control of the acquisition memory read-out controller, and to process the digital samples to produce processed digital samples;
an edge detector configured to detect an edge, representing a trigger, in the processed digital samples, and in response thereto to determine and output a measured trigger time;
a buffer memory configured to temporarily store the processed digital samples output by the digital signal processor at least until the edge detector detects the edge in the processed digital samples;
a trigger correction value generator configured to receive the measured trigger time from the edge detector, and in response thereto to determine and output a trigger correction value; and
a buffer memory read-out controller configured to receive the trigger correction value and in response thereto to control reading of the processed digital samples out of the buffer memory beginning at a corrected beginning address of the buffer memory determined from the calculated trigger address and the trigger correction value.

2. The system of claim 1, further comprising a display device configured to display the processed digital samples beginning at the corrected beginning address of the buffer memory.

3. The system of claim 1, wherein the digital signal processor is configured to perform at least one of vertical scaling, inversion, random dithering, bandwidth shaping, and interpolation of the digital samples to produce the processed digital samples.

4. The system of claim 1, wherein the trigger correction value generator is further configured to provide the trigger correction value to the acquisition memory read-out controller.

5. The system of claim 4, further comprising:
a second signal acquisition subsystem configured to receive a second input signal and in response thereto to output a plurality of second digital samples representing the second input signal; and
a second acquisition memory configured to receive the second digital samples and to store therein the second digital samples for at least one acquisition record of the second input signal,
wherein the acquisition memory read-out controller is further configured to control reading of the second digital samples out of the second acquisition memory beginning at a corrected beginning address of the second acquisition memory determined from the calculated trigger address and the trigger correction value.

6. The system of claim 5, wherein the digital signal processor is further configured to receive the second digital samples output from the second acquisition memory in response to the acquisition memory read-out controller, and to process the second digital samples to produce second processed digital samples.

7. The system of claim 1, wherein the edge detector and the buffer memory are configured to receive the same processed digital samples at a same time as each other, and the buffer memory is configured to store at least all of the processed digital samples from the beginning of the acquisition record until the detected edge, representing the trigger, in the processed digital samples.

8. The system of claim 1, wherein the digital signal processor is configured to receive the digital samples from the acquisition memory in two channels, including a first channel of the digital samples starting at a beginning address of the acquisition record in the acquisition memory and a second channel operating in parallel with the first channel beginning at an address which is a defined number of addresses prior to the calculated trigger address, the digital signal processor further being configured to process the digital samples of the first channel and output the processed digital samples of the first channel to the buffer memory, and in parallel to process the digital samples of the second channel and output the processed digital samples of the second channel to the edge detector.

9. The system of claim 8, wherein the trigger correction value generator is further configured to provide the trigger correction value to the acquisition memory read-out controller, and wherein the system is configured to compare a size of the acquisition record to a threshold, and is further configured such that when the size of the acquisition record exceeds the threshold:
the digital signal processor switches to processing a single channel of the digital samples starting at a beginning address of the acquisition record in the acquisition memory and outputting the processed digital samples of the single channel to the edge detector; and the acquisition memory read-out controller controls reading of the digital samples out of the acquisition memory a second time beginning at a corrected beginning address of the acquisition memory determined from the calculated trigger address and the trigger correction value.

10. The system of claim 8, wherein the trigger correction value generator is configured to determine the trigger correction value from only a subset of the processed digital samples from the digital signal processor which are in a defined range about the measured trigger time, excluding from the determination of the trigger correction value processed digital samples from the digital signal processor which are outside the defined range.

11. The system of claim 10, wherein a size of the buffer memory is approximately the same as the subset of the processed digital samples.

12. A method, comprising:
receiving an input signal and in response thereto outputting a plurality of digital samples representing the input signal;
storing the digital samples for at least one acquisition record of the input signal in an acquisition memory;
detecting a trigger event in the input signal and calculating a trigger address in the acquisition memory for a digital sample corresponding to the detected trigger event in the input signal;
performing digital signal processing on the digital samples output from the acquisition memory in response to an acquisition memory read-out controller to produce processed digital samples;
detecting an edge by an edge detector, representing a trigger, in the processed digital samples, and in response thereto determining and outputting a measured trigger time;
temporarily storing the processed digital samples output by the digital signal processor in a buffer memory at least until the edge detector detects the edge in the processed digital samples;
determining and outputting a trigger correction value in response to the measured trigger time from the edge detector;
determining a corrected beginning address of the buffer memory from the calculated trigger address and the trigger correction value; and
reading the processed digital data out from the buffer memory beginning at the corrected beginning address of the buffer memory.

13. The method of claim 12, further comprising displaying the processed digital samples on a display device, beginning at the corrected beginning address of the buffer memory.

14. The method of claim 12, further comprising receiving via a user interface one of more parameters for the display of the processed digital samples.

15. The method of claim 12, wherein performing the digital signal processing includes performing at least one of vertical scaling, inversion, random dithering, bandwidth shaping, and interpolation of the digital samples to produce the processed digital samples.

16. The method of claim 12, further comprising:
receiving a second input signal and in response thereto outputting a plurality of second digital samples representing the second input signal;
storing the second digital samples for at least one acquisition record of the second input signal in a second acquisition memory; and
reading the second digital samples out of the second acquisition memory beginning at a corrected beginning address of the second acquisition memory determined from a calculated trigger address and the trigger correction value.

17. The method of claim 16, further comprising processing the second digital samples to produce second processed digital samples.

18. The method of claim 12, further comprising storing in the buffer memory at least all of the processed digital samples from the beginning of the acquisition record until the detected edge, representing the trigger, in the processed digital samples.

19. The method of claim 12, further comprising processing the digital samples from the acquisition memory in parallel in two channels, including a first channel of the digital samples starting at a beginning address of the acquisition record in the acquisition memory and a second channel operating in parallel with the first channel beginning at an address which is a defined number of addresses prior to the calculated trigger address, and outputting the processed digital samples of the first channel to the buffer memory in parallel with outputting the processed digital samples of the second channel to an edge detector for detecting the edge, representing the trigger, in the processed digital samples within the subset of the processed digital samples.

20. The method of claim 19, further comprising comparing a size of the acquisition record to a threshold, and when the size of the acquisition record exceeds the threshold:
switching the digital signal processor to processing a single channel of the digital samples starting at a beginning address of the acquisition record in the acquisition memory, and outputting the processed digital samples of the single channel to the edge detector; and
reading the digital samples out of the acquisition memory a second time beginning at a corrected beginning address of the acquisition memory determined from the calculated trigger address and the trigger correction value.

* * * * *